(12) United States Patent
Fulkerson et al.

(10) Patent No.: US 9,972,969 B2
(45) Date of Patent: May 15, 2018

(54) COMPACT HIGH CURRENT, HIGH EFFICIENCY LASER DIODE DRIVER

(71) Applicant: LAWRENCE LIVERMORE NATIONAL SECURITY, LLC, Livermore, CA (US)

(72) Inventors: Edward Fulkerson, Livermore, CA (US); Rodney K. Lanning, Pleasanton, CA (US); Steven Telford, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days. days.

(21) Appl. No.: 14/766,954

(22) PCT Filed: Feb. 27, 2014

(86) PCT No.: PCT/US2014/019099
§ 371 (c)(1),
(2) Date: Aug. 10, 2015

(87) PCT Pub. No.: WO2014/134340
PCT Pub. Date: Sep. 4, 2014

(65) Prior Publication Data
US 2015/0372451 A1   Dec. 24, 2015

Related U.S. Application Data

(60) Provisional application No. 61/770,870, filed on Feb. 28, 2013.

(51) Int. Cl.
*H01S 5/024* (2006.01)
*H01S 5/042* (2006.01)
(Continued)

(52) U.S. Cl.
CPC ............ *H01S 5/0428* (2013.01); *G01R 1/203* (2013.01); *H01S 5/02423* (2013.01);
(Continued)

(58) Field of Classification Search
CPC ............. H01S 5/02423; H01S 5/02438; H01S 5/02469
(Continued)

(56) References Cited

U.S. PATENT DOCUMENTS 4,819,242 A * 4/1989 Kaku ..................... G11B 7/126
                                                              372/25
4,858,071 A    8/1989 Manabe et al.
(Continued)

FOREIGN PATENT DOCUMENTS

JP        09298261 A     11/1997
JP        09298378 A     11/1997
(Continued)

OTHER PUBLICATIONS

PCT/US2014/019099, "International Search Report and Written Opinion", Aug. 8, 2014, 12 pages.
(Continued)

*Primary Examiner* — Tod T Van Roy
(74) *Attorney, Agent, or Firm* — Kilpatrick Townsend & Stockton LLP

(57) ABSTRACT

A device includes a u-channel shaped member and a printed circuit board including a plurality of capacitors. Each of the plurality of capacitors has a mounting surface mounted to the printed circuit board and an opposing heat transfer surface thermally coupled to the u-channel shaped member. The device also includes an output cable coupled to the printed circuit board and a return cable coupled to the printed circuit board. The device further includes a control transistor disposed inside the u-channel shaped member and
(Continued)

a current sensing resistor disposed inside the u-channel shaped member.

10 Claims, 5 Drawing Sheets

(51) Int. Cl.
  *H01S 5/40* (2006.01)
  *G01R 1/20* (2006.01)
  *H01S 5/0683* (2006.01)
(52) U.S. Cl.
  CPC ...... *H01S 5/02438* (2013.01); *H01S 5/02469* (2013.01); *H01S 5/0427* (2013.01); *H01S 5/4018* (2013.01); *H01S 5/06832* (2013.01)
(58) Field of Classification Search
  USPC .................................................... 372/34–36
  See application file for complete search history.

(56) References Cited

U.S. PATENT DOCUMENTS

| | | | | |
|---|---|---|---|---|
| 5,455,739 | A * | 10/1995 | Barden | H05K 7/20445 165/80.3 |
| 5,930,135 | A | 7/1999 | Janko | |
| 6,198,642 | B1 | 3/2001 | Kociecki | |
| 6,385,226 | B2 | 5/2002 | McMinn et al. | |
| 6,404,628 | B1 | 6/2002 | Nagashima et al. | |
| 2002/0033418 | A1 | 3/2002 | Knowles et al. | |
| 2002/0160742 | A1 | 10/2002 | Hasegawa et al. | |
| 2004/0228588 | A1* | 11/2004 | Eldring | H01S 5/423 385/94 |
| 2004/0252953 | A1* | 12/2004 | Crane, Jr. | G02B 6/3839 385/92 |
| 2006/0274796 | A1* | 12/2006 | Cheng | H01S 5/02212 372/29.021 |
| 2007/0002594 | A1* | 1/2007 | Otsuka | H02M 7/003 363/37 |
| 2011/0051759 | A1* | 3/2011 | Telford | H01S 5/02248 372/35 |
| 2011/0085576 | A1 | 4/2011 | Crawford et al. | |
| 2012/0140418 | A1 | 6/2012 | Taka et al. | |
| 2012/0327602 | A1 | 12/2012 | Kulkarni et al. | |
| 2013/0163627 | A1* | 6/2013 | Seurin | H01S 5/423 372/36 |
| 2013/0259074 | A1* | 10/2013 | Newman | H01S 3/04 372/35 |
| 2014/0219302 | A1* | 8/2014 | Canumalla | H01L 21/82 372/36 |

FOREIGN PATENT DOCUMENTS

| | | |
|---|---|---|
| JP | 2007258385 A | 10/2007 |
| JP | 2008198751 A | 8/2008 |
| JP | 2010225674 A | 10/2010 |
| WO | 2014134340 A1 | 9/2014 |

OTHER PUBLICATIONS

Bayramian, et al., "Compact, efficient, low-cost diode power conditioning for laser inertial fusion energy", High Power Lasers for Fusion Research, SPIE, 1000 20th St. Bellingham WA 98225-6705 USA, vol. 7916, No. 1 Feb. 10, 2011, pp. 1-5.
EP14757101.2, "Extended European Search Report", Oct. 18, 2016, 7 pages.
Kovalchuk, et al., "Capacitor Bank Module for a Multimegajoule Energy Storage", Oct. 1, 2008, pp. 2651-2657.
JP2015-560324, "Office Action", dated Feb. 9, 2018, 8 pages.

* cited by examiner

COMPACT HIGH CURRENT, HIGH EFFICIENCY LASER DIODE DRIVER

CROSS-REFERENCES TO RELATED APPLICATIONS

This application claims priority to U.S. Provisional Patent Application No. 61/770,870, filed on Feb. 28, 2013, entitled "Compact High Current, High Efficiency Laser Diode Driver," the disclosure of which is hereby incorporated by reference in its entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory

BACKGROUND OF THE INVENTION

Laser diodes are inherently low impedance devices. Driving these types of loads at high electrical efficiencies places severe electrical resistance restrictions on the driver electronics. Two major contributors to the electrical resistance budget are the interconnecting cables to the laser diode loads and switching electronics losses. If the frontal area of the drivers is reduced, it creates significant thermal management issues.

Despite the progress made in laser diode drivers, there is a need in the art for a mechanism that will enable reduction in the electrical resistance while at the same time providing adequate thermal dissipation to ensure reliability and longevity of the entire laser diode driver circuit and system.

SUMMARY OF THE INVENTION

Embodiments of the present invention provide a method for reducing the total area occupied by a laser diode driver while reducing the thermal stress on the laser diode drivers. This allows more packing density for the laser diode drivers and results in shorter cable lengths. These improvements significantly lower the electrical resistance of the entire circuit resulting in a more reliable and accurate functioning circuit.

As described herein, embodiments of the present invention provide laser diode drivers that have a number of features suitable for high current pulser operation that not available in conventional devices. These features include the low overall volume of the device, the low impedance paths that are utilized, the low inductance paths that are utilized, and improved thermal management through the use of low thermal impedance pathways. The design described herein provides a compact design in which the leads from the pulser to the laser diodes are shorter than in conventional systems and are characterized by lower resistance and lower inductance. The frontal area of the laser diode driver is decreased by the designs described herein, resulting in the ability to pack a plurality of the laser diode drivers in an array configuration to provide an efficient laser drive unit.

According to an embodiment of the present invention, a device is provided. The device includes a u-channel shaped member and a printed circuit board including a plurality of capacitors. Each of the plurality of capacitors has a mounting surface mounted to the printed circuit board and an opposing heat transfer surface thermally coupled to the u-channel shaped member. The device also includes an output cable coupled to the printed circuit board and a return cable coupled to the printed circuit board. The device further includes a control transistor disposed inside the u-channel shaped member and a current sensing resistor disposed inside the u-channel shaped member.

According to another embodiment of the present invention, a laser drive unit is provided. The laser drive unit includes an enclosure and a plurality of cooling plates mounted in the enclosure and separated from each other by a predetermined distance. The laser drive unit also includes a supply of cooling fluid coupled to each of the plurality of cooling plates, a fluid return coupled to each of the plurality of cooling plates, and a plurality of laser diode drivers. Each of the laser diode drivers includes a u-channel shaped member having a bottom surface, a plurality of capacitors mounted to the bottom surface of the u-channel shaped member, a control transistor disposed inside the u-channel shaped member, and a current sensing resistor disposed inside the u-channel shaped member. The laser drive unit further includes a lid attached to the u-channel shaped member. Each of the plurality of laser diode drivers has the bottom surface of the u-channel shaped member in thermal contact with one of the plurality of cooling plates.

In a specific embodiment, one or more laser diode drivers are tightly packed in a housing that includes a metal u-channel. The u-channel provides a low inductance/low resistance path to the voltage spikes generated in the circuit. In addition, the u-channel also provides heat sink functionality for dissipating the thermal energy generated by the laser diode drivers.

Some embodiments of the present invention provide a housing with a u-shaped metal channel. The housing provides mechanical and thermal support for a laser diode driver and the u-channel can provide a heat sink for switching elements and capacitor intermediate energy storage. The u-channel may also provide a low loss electrical connection improving rise time and electrical efficiency of the laser diode driver circuit.

In a particular embodiment, the switching electronics and capacitive energy storage elements are mounted in the metal u-channel. The metallic cases of the capacitors may be directly clamped to the u-channel. Electrically, the u-channel provides a low impedance return path for the large pulse currents flowing in the laser diode loads. The low impedance of the u-channel reduces resistive losses and also minimizes the overall loop inductance of the driver circuit. The loop inductance places voltage stresses on both the electrical switching components and the diode loads. Hence, it is beneficial to reduce the loop inductance. Each time the diode driver produces a pulse of output current; there is a pair of voltage spikes caused by the rapid rate of rise and fall of the current interacting with the inductance. These voltage spikes can damage the laser diodes or the driver electronics. The housing with the u-channel according to embodiments of the present invention provides a low inductance/low resistance path for the voltage spikes so that the laser diodes and/or the diode driver electronics are shielded from these voltage spikes.

Thermally the u-channel provides a cooling path (i.e., heat sink) for the switching elements, current measuring resistors, and the capacitors. In a tightly packed laser diode array, each driver's u-channel can have a direct electrical connection with the adjoining drivers. The u-channels together provide the negative power supply connection thus reducing the number of cables required to provide DC power to the laser diode array.

Numerous benefits are achieved by way of the present invention over conventional techniques. For example, embodiments of the present invention provide a small form factor laser diode driver with the higher current density per driver size than conventional designs. Moreover, passive cooling of the laser diode driver components is utilized; removing the active cooling elements (e.g., cooling water lines) typically integrated into high current laser diode drivers. Some embodiments reduce the frontal cross-sectional area, which allows the laser diode driver to be located closer to the laser diode load. This shorter path provides several benefits: 1. A further reduction in the resistive interconnection loses; 2. Reduced parasitic inductance reduces voltage stress on the switching elements and laser diode load; 3. The complexity and length of the DC input power connections are also reduced, resulting in fewer resistive losses; and 4. The design allows for a smaller foot print for the overall laser system, reducing overall system costs. Moreover, in an embodiment, the cooling design provides for better high voltage integrity by separating the coolant from the high voltage elements (e.g., capacitors/switches). The cooling system also allows, in some embodiments, for the elimination of mechanical cooling system (e.g., fans), which are prone to failure. These and other embodiments of the invention along with many of its advantages and features are described in more detail in conjunction with the text below and attached figures.

DETAILED DESCRIPTION OF SPECIFIC EMBODIMENTS

High average power diode laser arrays used for pumping of laser amplifiers, which may be used for IFE (Inertial Fusion Engine) power plants, utilize power conditioning systems to pulse the diode laser arrays at precise currents, pulse rates, and duty factors. Precise control of the current levels, pulse rates, and timing to trigger the laser diodes in the array is needed in order to generate optimum conditions in the IFE power plants.

Diode Pumper Solid State Lasers (DPSSL) used for IFE power plants may include thousands of high current (e.g., up to 800 A) diode drivers for each laser beam control unit. These diode drivers are usually compact to provide high packing density to reduce interconnection loses from the diode drivers to the laser diode array. In addition, the diode drivers may operate a frequency of between 10 and 300 times per second in order to control the laser arrays. Due the tight packing, high current output, and the frequency of operation, these diode drivers generate tremendous amount of heat, which needs to be dissipated effectively and quickly.

Figure 1:
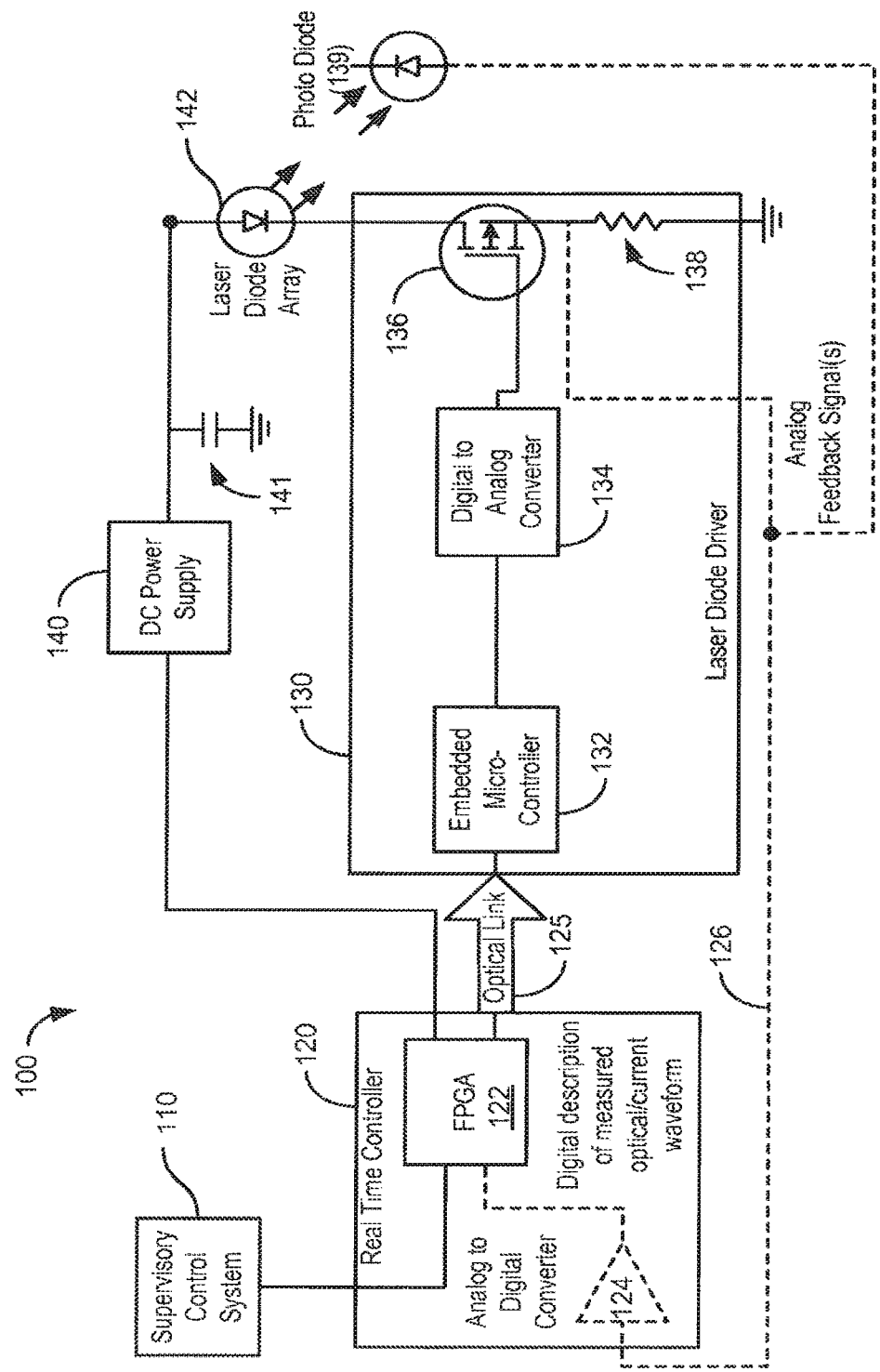
FIG. 1 is a simplified schematic block diagram of a laser diode pulser according to an embodiment of the present invention.

FIG. 1 is a simplified schematic block diagram of a laser diode pulser according to an embodiment of the present invention. The laser diode pulser 100 includes a supervisory control system 110 that provides a digital description of the desired optical and current waveforms. The pulser also includes a real time controller 120 that includes an FPGA 122 and an analog-to-digital (A/D) converter 124 that provides a digital description of the measured optical and current waveforms received using a feedback loop 126.

An optical link 125 is provided between the real time controller 120 and the laser diode driver 130. The laser diode driver 130 includes an embedded micro-controller 132 that provides a digital description of the desired gate drive. The signal from the embedded micro-controller 132 is provided to a digital-to-analog (D/A) converter 134 that outputs an analog gate drive signal, which is used to drive transistor 136, which serves as a current regulating element.

The FGPA is connected to a DC power supply 140 that, in turn, is connected to a capacitor bank 141 and the laser diode array 142. Additional description related to the capacitor bank 141 is provided in relation to FIG. 2. Current is regulated by drive transistor 136 to flow from the DC power supply through the laser diode array 142 and through current viewing resistor 138 to ground. In an embodiment, the laser diode array 142 includes high energy laser diodes arranged in a tile-based layout for high energy applications. An analog feedback signal is provided through feedback loop 126 as discussed above. In addition to current waveforms, a photo diode 139 or other suitable detector is used to provide optical feedback waveforms to the feedback loop 126. As illustrated in FIG. 1, the DC energy is stored in the capacitor bank 141. The high current pulsed current loop is from the capacitor bank 141 through the laser diode array 140 and switching elements (i.e., drive transistor 136) back to the "low" side of the capacitor bank. In this way, as illustrated in additional detail in FIG. 5, a system of 45 laser diode drivers can drive over 27 kA of peak pulsed current into the laser diode array while drawing less than 100 A from the DC power supply.

Figure 2:
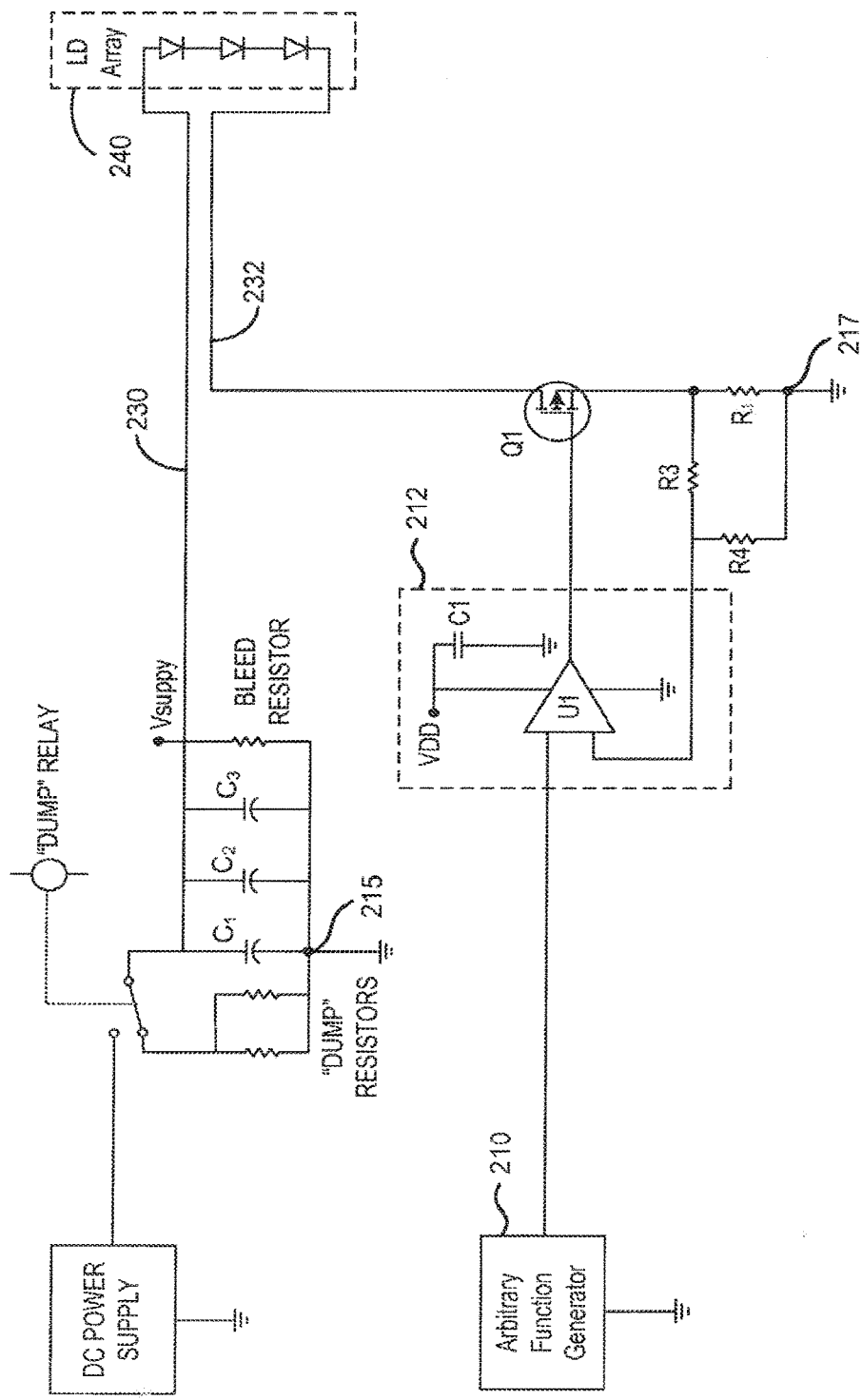
FIG. 2 is a simplified schematic circuit diagram of a laser diode pulser according to an embodiment of the present invention.

FIG. 2 is a simplified schematic circuit diagram of a laser diode driver according to an embodiment of the present invention. The schematic circuit diagram illustrated in FIG. 2 is merely exemplary and includes devices to represent circuit elements. In actual implementation, additional devices and circuit elements can be added, substituted, or removed as appropriate to the particular application. Therefore, the simplified schematic circuit diagram should be understood as exemplary and not limiting the present invention.

A DC power supply is provided to drive the circuit. As illustrated in FIG. 2, the supply voltage Vsuppy is connected to ground through a bank of capacitors $C_1$, $C_2$, and $C_3$. The bank of capacitors $C_1$, $C_2$, and $C_3$ are illustrated as capacitor bank 141 in FIG. 1. As described more fully below, the capacitors $C_1$, $C_2$, and $C_3$ have one terminal electrically connected and thermally coupled to the base of the u-channel shaped member, so that the thermal impact of the high currents is transferred to the body of the pulser by the capacitors. Thus, embodiments of the present invention provide for efficient current flow, with low inductance, which results in reduced control requirements, and low resistance, which reduces system losses.

The output of the laser diode driver is provided as a pulsed voltage on output cable 230, with a return cable 232. In some embodiments, the output cable 230 and the return cable 232 are provided in a low inductance coaxial cable, but this is not required by the present invention. In other embodiments, a ribbon cable is utilized. The pulsed voltage provides the drive current to the laser diode array 240. The return cable 232 is not grounded since the laser diodes are floating above ground in this implementation.

Although three capacitors C1, C2, and C3 are illustrated in FIG. 2, the present invention is not limited to this particular number and a smaller number or greater number of capacitors can be utilized depending on the particular application. In some implementations, up to or more than ten capacitors can be utilized to achieve efficiency goals. As an example, as the length of the u-channel shaped member is increased, it provides additional space for the mounting of additional capacitors, which increases electrical efficiency. One of ordinary skill in the art would recognize many variations, modifications, and alternatives.

In order to provide for device safety, dump resistors and one or more bleed resistors are provided as illustrated since the laser diode driver can store on the order of 100 Joules of energy. It should be noted that in an implementation using three capacitors, more energy can be stored if the number or capacity of the capacitors is increased. As discussed in relation to FIG. 5, a bank of laser diode drivers 300 can be assembled as a larger unit. In the embodiment illustrated in FIG. 5, 45 laser diode drivers are installed as a group, resulting in energy storage on the order of 4.5 kJoules. As illustrated in FIG. 2, the return current to the "low side" of the capacitors is conducted by the u-channel 310 shown in FIG. 3, which is electrically equivalent to ground nodes 215 and 217.

Embodiments of the present invention include an arbitrary function generator 210 that shapes the pulses provided by the laser diode pulser and include protection circuitry integrated in the pulser to protect the pulser during startup and shutdown. In an embodiment, the arbitrary function generator is provided on an arbitrary function generator circuitry board 412 that is mounted on the printed circuit board 410. The use of the arbitrary waveform generator allows for the exact shape of the pulse to be optimized for the desired laser performance, system efficiency, and diode protection for each application of the diode pulser.

Current control transistor Q1 receives the return line 232 from the laser diode array and has gate control provided by a control signal from the arbitrary function generator 210 and the feedback control circuitry 212, which is mounted on the printed circuit board 410. The drain of the current control transistor Q1 is connected to the return line and the source is connected to one or more current sense resistors R1, illustrated as a single resistor. Multiple resistors in parallel can be utilized depending on the particular implementation. In an embodiment, the current sense resistors are 2 mΩ, 100 W resistors that are connected in parallel between the drain of Q1 and ground. Thus, some embodiments of the laser diode driver are characterized by an internal resistance (including the ESR of the capacitors) less than 10 mΩ. Discounting the ESR of the capacitors (e.g., 8.5 mΩ in some implementations) the combined resistance of the u-channel shaped member, the circuit board, the output buses, and connectors is on the order of 1.5 mΩ or less. In one implementation, the loop inductance of the complete diode laser driver is less than 136 nH. In some implementations, a plurality of transistors (e.g., FETs) connected in parallel are utilized to switch the current illustrated by the single transistor Q1.

Figure 3:
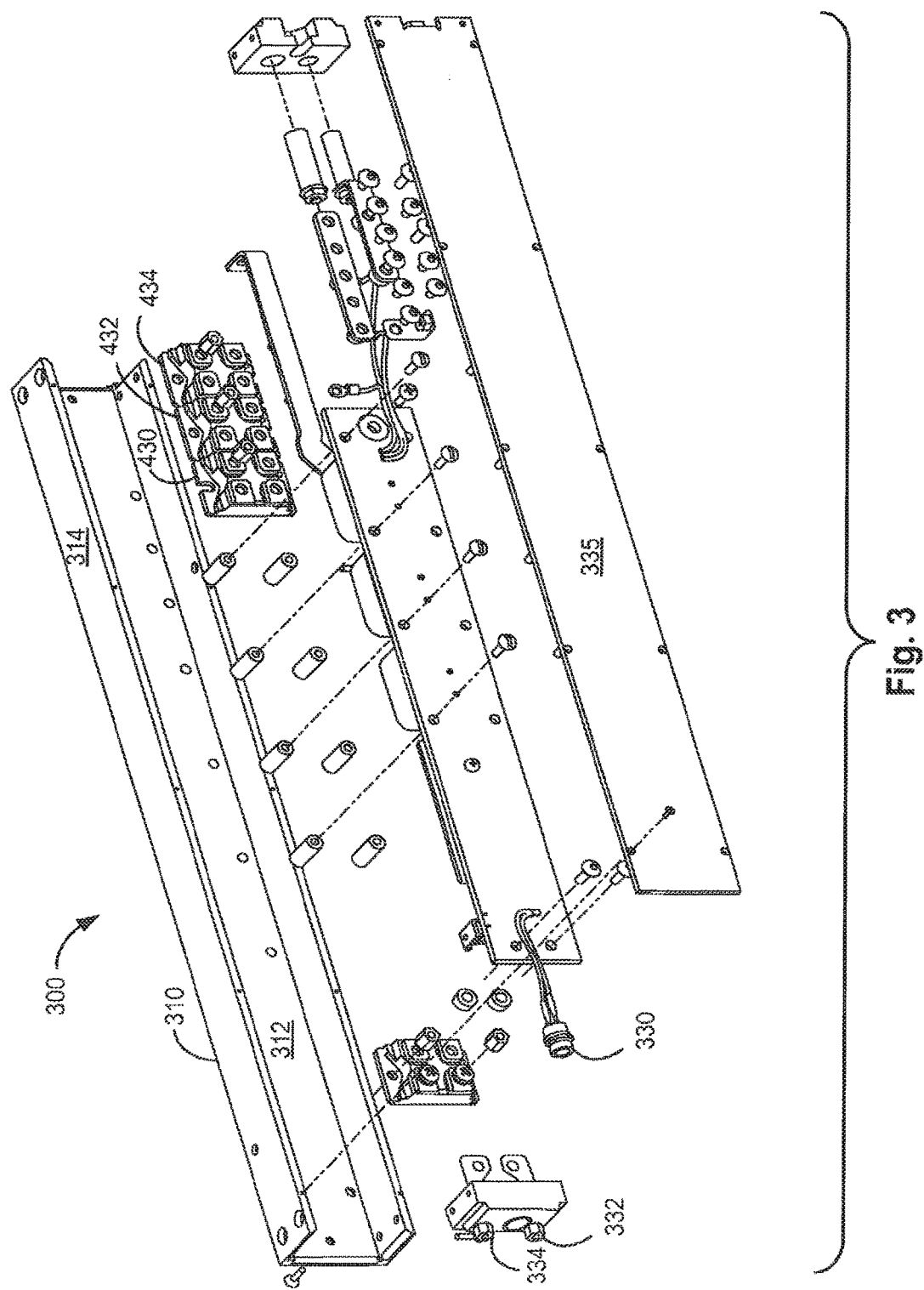
FIG. 3 is an exploded view of a laser diode driver from a first perspective according to an embodiment of the present invention.

FIG. 3 is an exploded view of a laser diode driver from a first perspective according to an embodiment of the present invention. As illustrated in FIG. 3, the laser diode driver 300 includes a u-channel shaped member 310 (also referred to as a u-channel) and a lid 335 that is used to enclose the elements disposed within the u-channel shaped member. In an embodiment, the u-channel shaped member 310 is fabricated from metal or other suitable material that provides mechanical rigidity, low electrical impedance, and high thermal conductivity. As described more fully below, the heat generating devices in the laser diode driver 300 are thermally connected to the base of the u-channel shaped member 310 so that heat flows to the base 312 of the u-channel and then can be removed from the u-channel shaped member by thermally connecting the u-channel to a cold plate (not shown), which can be actively or passively cooled. Typically, because of the high power dissipation utilized in some embodiments, the cold plate, also referred to as a cooling plate, is actively cooled. In some embodiments, the bottom of the u-channel is mounted to the cold plate, which can run the entire length of the u-channel shaped member. In contrast with these conventional designs, in which cooling water flows into the laser diode driver through tubes that provide the cooling water to actively cool the components of the laser diode driver at the components, embodiments of the present invention transfer heat from the components of the laser diode driver to the u-channel shaped member and then to the cold plate, which can be actively cooled, thereby providing, among other benefits, increases in reliability and packing density.

In some implementations, the sides of the laser diode driver (e.g., side 314) can be mounted to a cold plate of other thermal structure. These implementations are typically utilized when heat loads are at lower levels but higher packing density is desired. One of ordinary skill in the art would recognize many variations, modifications, and alternatives.

As illustrated in FIG. 3, DC input power port 332, photodiode receiver port 330, and a dump circuit output port 334 are provided at one end of the laser diode driver. The pulsed output to the laser diode arrays is provided through output cables (not shown) at the opposing end of the laser diode driver. This output is described in relation to pulsed output cable 230 and return cable 232 illustrated in FIG. 2.

Figure 4:
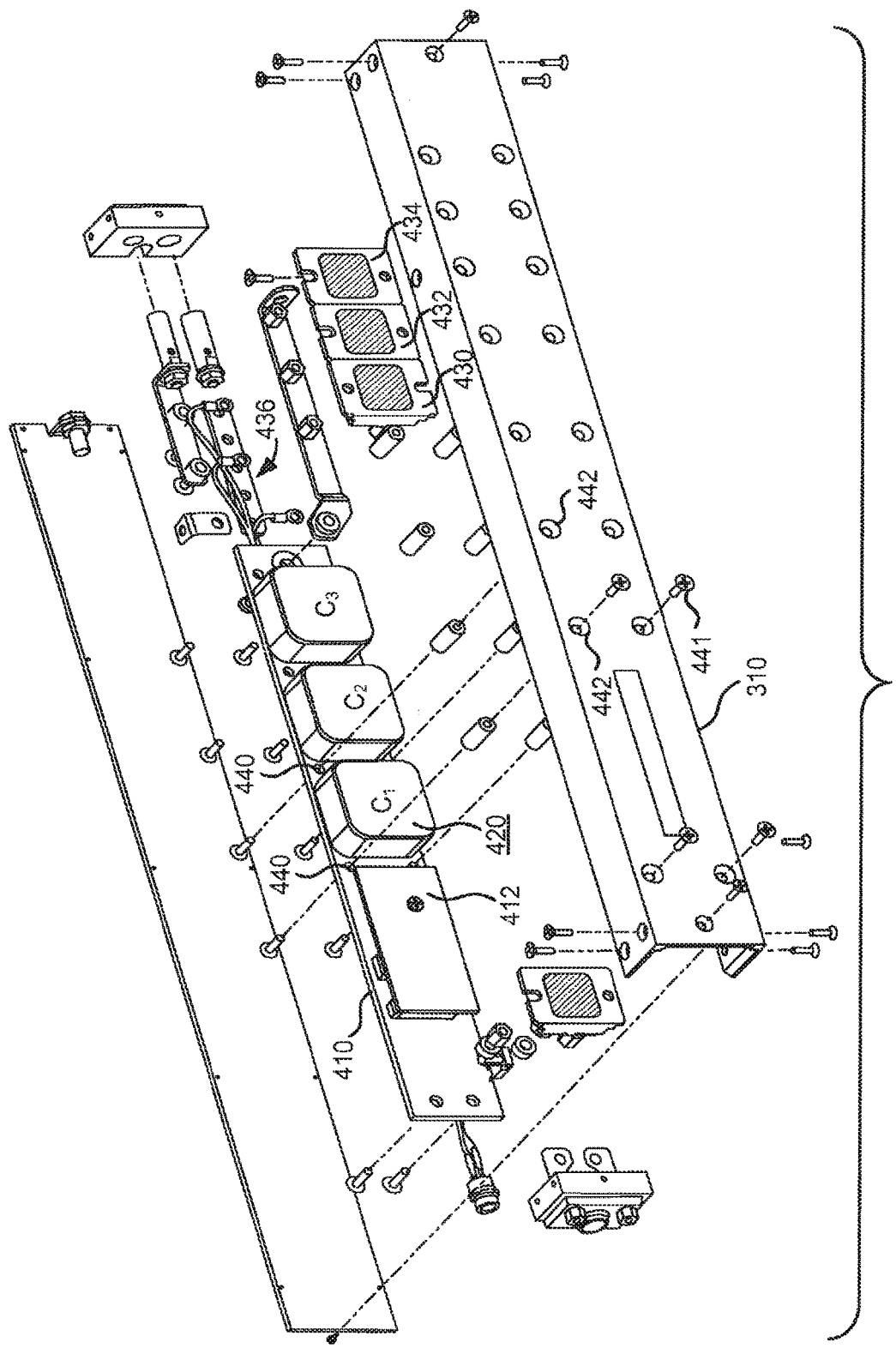
FIG. 4 is an exploded view of a laser diode driver from a second perspective according to an embodiment of the present invention.

As described in additional detail in relation to FIG. 4, current control devices 430, 432, and 434, which are able to handle high currents, are mounted to the bottom surface 312 of the u-channel shaped member 310. The channel and the current control devices provide mechanical and thermal support for transistors and resistors used in current control and current sensing operations.

FIG. 4 is an exploded view of a laser diode driver from a second perspective according to an embodiment of the present invention. The surfaces 420 of capacitors $C_1$, $C_2$, and $C_3$ define the negative electrical contact of the capacitor and are mounted to the bottom surface 312 of the u-channel shaped member 310, which is grounded. The large surface area associated with surfaces 420 of the capacitors assists in the heat transfer from the capacitors to the bottom of the u-channel since approximately half the heat dissipation of the pulser is associated with the capacitors.

In order to obtain high heat transfer and low impedance between the heat transfer surfaces of the plurality of capacitors and the base surface 312 of the u-channel shaped member, the printed circuit board includes a plurality of through holes 440 that are operable to receive attachment devices, for example, screws 441, which, when attached to the u-channel shaped base through corresponding through holes 442 in the u-channel shaped base, apply pressure between the heat transfer surfaces of the plurality of capacitors and the u-channel shaped base. Thus, embodiments enable clamping of the printed circuit board 410 to the u-channel shaped base 310, which increases the physical connection between the heat transfer surfaces of the capacitors, and, as a result, improved heat transfer. In addition to improved heat transfer through increased thermal conductivity, the clamping of the printed circuit board 410 to the u-channel shaped base increases the electrical conductance and lowers the impedance since the electrical contact surfaces of the capacitors are pressed against the bottom of the u-channel to provide a good electrical contact. As illustrated in FIG. 4, the broad surface 420 of the capacitors provides a large conductive area, thereby reducing both thermal and electrical impedance.

Referring to FIGS. 2 and 4, the common electrical node 215 corresponds to the inner bottom surface of u-channel shaped member 310 and the surfaces 420 of the capacitors, which are in contact with the inner bottom surface of the u-channel. It should be noted that node 217 is equivalent to node 215, with node 215 representing the grounded end of the capacitors and node 217 representing the grounded end of the current sense resistors that are in electrical contact with the inner bottom surface of the u-channel. Thus, the u-channel shaped member is grounded as described herein.

Current control devices 430, 432, and 434 are mounted to the side of the printed circuit board 410 and electrically connected to the printed circuit board using electrical leads 436. The current control devices 430, 432, and 434 provide mounting locations for circuit elements Q1 (e.g., two transistors, each mounted on one of device 432 and 434) and R1 (e.g., on device 430) illustrated in FIG. 2. As discussed in relation to FIG. 2, in an embodiment, two current control transistors in parallel are utilized and illustrated as Q1. In a specific embodiment, the two current control transistors can be mounted on two of the current control devices with the current sense resistors mounted in parallel on the remaining current control device, although this is not required by the present invention and other configurations can be utilized.

The current control devices 430, 432, and 434 are mounted to the inner bottom surface 312 of the u-channel shaped member 310 and are also illustrated in FIG. 3. As illustrated in FIG. 3, the current viewing resistor(s) and the control transistor(s) are packaged in thermally conductive, electrically isolated packages. Heat generated in the current control FET Q1 and the current sense resistor R1 is transferred to the u-channel shaped member. Accordingly, the current control devices are characterized by high electrical resistance and high thermal conductivity, with heat flow to the u-channel enhanced by the use of thermally conductive grease between the current control devices and the u-channel. Referring to FIG. 4, arbitrary function generator circuitry board 412 is mounted to the PCB, which also includes the capacitors.

As illustrated by examining FIGS. 2 and 4, the current flow path from the top of the capacitors, through the drive (e.g., coaxial) cable to the laser diode array, and back along the return path to the transistors illustrated by Q1 to ground through the sense resistors, is designed to achieve low inductance and low resistance. This design extends to the geometric layout of the various components to provide a high packing density and short thermal and wide electrical paths. The use of the body of the laser diode driver, particularly the u-channel shaped member, to provide a low impedance connection to ground provides benefits not available using conventional techniques.

Figure 5:
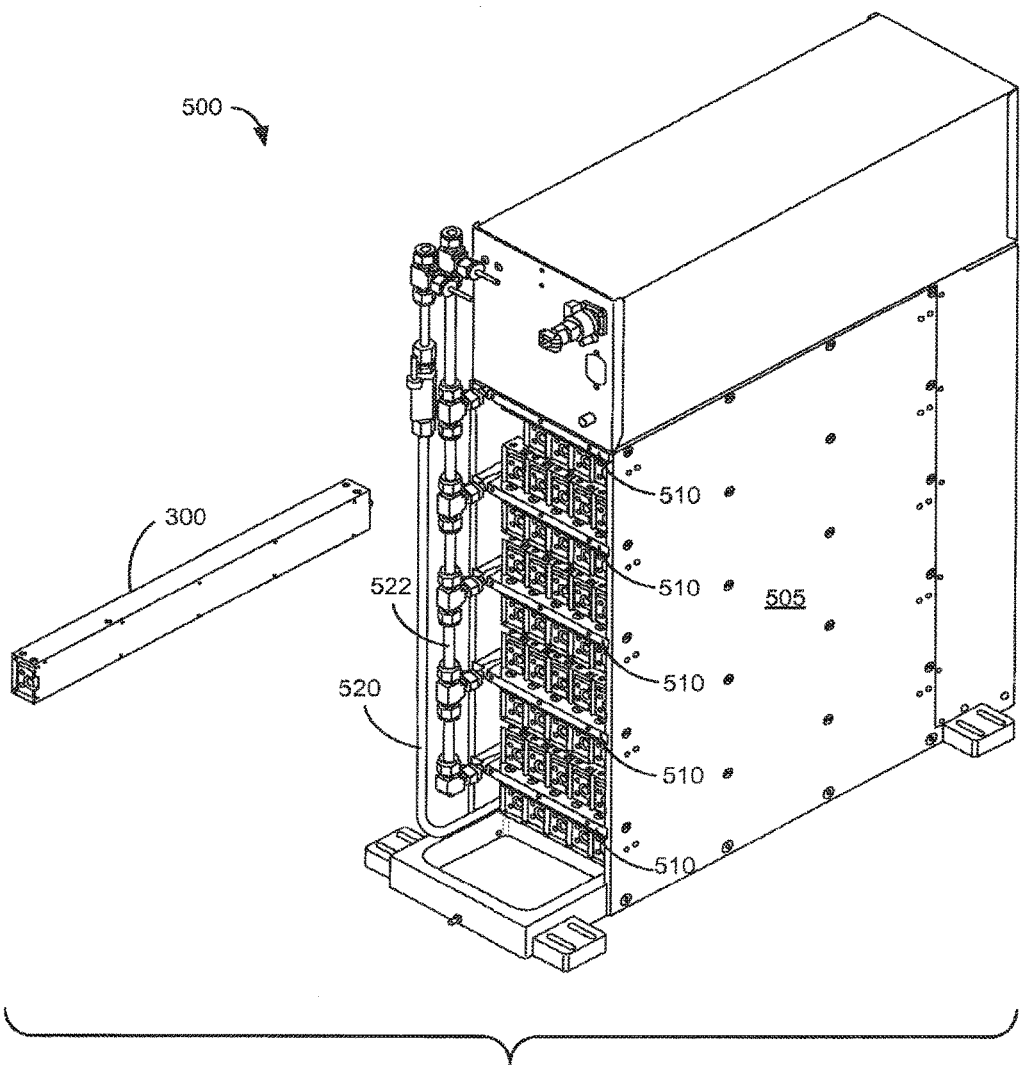
FIG. 5 is a simplified perspective diagram illustrating a laser drive unit according to an embodiment of the present invention.

FIG. 5 is a simplified perspective diagram illustrating a laser drive unit according to an embodiment of the present invention. In an embodiment, the laser drive unit 500 produces 27 kA of output current in a unit approximately the size of a desktop computer. The laser drive unit 500 includes a plurality of laser diode drivers 300 packed into a bank configuration inside an enclosure 505. In this example, 45 laser diode drivers are arrayed in a layout that is 5×9. The packing of the laser diode drivers in a side by side configuration on a cooling plate enable the heat generated in the drivers to be extracted efficiently.

As discussed above, the thermal load from the capacitors in the laser diode driver 300 is deposited in the bottom of the u-channel, which is mounted adjacent a cold plate. Five cold plates 510 (also referred to as cooling plates) are mounted in the enclosure and separated from each other by a predetermined distance to enable for loading of the laser diode drivers between the cold plates. The cold plates are utilized to cool the bottom surfaces of the u-channel mounted adjacent to the cold plates. The cold plates typically utilize chilled water provided through a supply of cooling fluid (e.g., chilled water or other suitable fluid) coupled to each of the plurality of cooling plates (e.g., chilled water input lines 520 to supply chilled water to the cold plates and chilled water output lines 522 to remove heat from the laser drive units). The design illustrated in FIG. 5 provides electromagnetic interference (EMI) benefits in comparison with conventional systems since a low inductance common ground is utilized, with each set of laser diode drivers mounted on one of the cooling plates and electrically connected to the cooling plate.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A laser drive unit comprising:
an enclosure;
a plurality of cooling plates mounted in the enclosure and separated from each other by a predetermined distance;
a supply of cooling fluid coupled to each of the plurality of cooling plates;
a fluid return coupled to each of the plurality of cooling plates;
a plurality of laser diode drivers, wherein each of the plurality of laser diode drivers includes:
a u-channel shaped member having a bottom surface;
a printed circuit board;
a plurality of capacitors, wherein each of the plurality of capacitors has a mounting surface mounted to the printed circuit board and an opposing heat transfer surface mounted to and electrically grounded to the bottom surface of the u-channel shaped member;
a control transistor disposed inside the u-channel shaped member;
a current sensing resistor disposed inside the u-channel shaped member; and
a lid attached to the u-channel shaped member, wherein each of the plurality of laser diode drivers has the bottom surface of the u-channel shaped member in thermal contact with one of the plurality of cooling plates, wherein:
the bottom surface of the u-channel shaped member of a first laser diode driver is mounted adjacent one of the plurality of cooling plates and the lid of the first laser diode driver is disposed between the one of the plurality of cooling plates and another of the plurality of cooling plates; and the bottom surface of the u-channel shaped member of a second laser diode driver is mounted adjacent the another of the plurality of cooling plates and the lid of the second laser diode driver is disposed adjacent the lid of the first laser diode driver.

2. The laser drive unit of claim 1 wherein a set of laser diode drivers are disposed adjacent each other and in thermal contact with one of the plurality of cooling plates.

3. The laser drive unit of claim 1 wherein each of the plurality of laser diode drivers further comprises an output cable and a return cable.

4. The laser drive unit of claim 3 wherein the output cable and the return cable are provided in a single coaxial cable.

5. The laser drive unit of claim 3 wherein the u-channel shaped member is characterized by a longitudinal direction.

6. The laser drive unit of claim 5 wherein the plurality of capacitors are arrayed in the longitudinal direction.

7. The laser drive unit of claim 3 wherein the printed circuit boards have a plurality of through holes operable to receive attachment devices, which, when attached to the u-channel shaped member, apply pressure to the heat transfer surfaces of the plurality of capacitors mounted to the bottom surface of the u-channel shaped member.

8. The laser drive unit of claim 3 wherein the plurality of capacitors are connected in parallel.

9. The laser drive unit of claim 3 further comprising a thermal grease disposed between the heat transfer surfaces of the plurality of capacitors and the bottom surface of the u-channel shaped member.

10. The laser drive unit of claim 3 wherein each of the plurality of laser diode drivers is characterized by a height measured in a direction normal to the bottom surface of the u-channel shaped member and the predetermined distance is approximately twice the height.

* * * * *